United States Patent
Lin

(10) Patent No.: US 11,869,900 B2
(45) Date of Patent: Jan. 9, 2024

(54) ELECTRONIC DEVICE

(71) Applicant: InnoLux Corporation, Miao-Li County (TW)

(72) Inventor: Chun-Hsien Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 170 days.

(21) Appl. No.: 17/476,680

(22) Filed: Sep. 16, 2021

(65) Prior Publication Data
US 2022/0139963 A1     May 5, 2022

(30) Foreign Application Priority Data

Oct. 29, 2020   (CN) .......................... 202011182325.8

(51) Int. Cl.
*H01L 27/12*   (2006.01)
*H01L 25/18*   (2023.01)
*H01L 25/16*   (2023.01)
*H10K 59/131*   (2023.01)

(52) U.S. Cl.
CPC ............ *H01L 27/124* (2013.01); *H01L 25/18* (2013.01); *H01L 25/167* (2013.01); *H10K 59/131* (2023.02)

(58) Field of Classification Search
CPC ...... H01L 27/124; H01L 25/18; H10K 59/131
See application file for complete search history.

(56) References Cited

U.S. PATENT DOCUMENTS

| | | | |
|---|---|---|---|
| 2018/0114820 A1* | 4/2018 | Shim | H10K 59/122 |
| 2020/0013803 A1 | 1/2020 | Jang et al. | |
| 2020/0135126 A1* | 4/2020 | Yokoyama | G09G 3/3648 |
| 2021/0375702 A1* | 12/2021 | Xiao | G09G 3/006 |
| 2022/0068998 A1* | 3/2022 | Luo | H01L 33/62 |

FOREIGN PATENT DOCUMENTS

| | | |
|---|---|---|
| CN | 111402754 A | 7/2020 |
| WO | 2019/167966 A1 | 9/2019 |

OTHER PUBLICATIONS

Chinese language office action dated May 9, 2022, issued in application No. TW 110124140.

* cited by examiner

*Primary Examiner* — James A Dudek
(74) *Attorney, Agent, or Firm* — McClure, Qualey & Rodack, LLP

(57) ABSTRACT

An electronic device is provided. The electronic device includes a substrate, a light-emitting unit, and a circuit layer. The substrate has a first surface and a second surface, and the second surface is opposite the first surface. The light-emitting unit is disposed on the first surface, and the circuit layer is disposed on the second surface. The circuit layer includes a first layer and a second layer. The second layer is disposed on the first layer. The first layer includes a plurality of first wirings. The second layer includes a plurality of second wirings. The plurality of first wirings intersect with the plurality of second wirings.

17 Claims, 8 Drawing Sheets

ELECTRONIC DEVICE

CROSS REFERENCE TO RELATED APPLICATIONS

This application claims the benefit of China Application No. 202011182325.8, filed Oct. 29, 2020, the entirety of which is incorporated by reference herein.

BACKGROUND

Technical Field

The present disclosure is related to an electronic device, and in particular it is related to the circuit configuration of an electronic device.

Description of the Related Art

With the flourishing development of electronic products, consumers have high expectations for the quality and functionality of electronic products (including panels). The signal lines and/or power lines of the electronic device are often arranged on the same side of the substrate to save space. However, the excessive gathering of signal lines and/or power lines on a certain side of the substrate may cause uneven current distribution, heat accumulation, or power dissipation, which can affect the quality of the displayed image, such as uneven image brightness. Therefore, the development of a structural design that can improve the reliability or performance of a panel is still currently an important research topic in the industry.

SUMMARY

In accordance with some embodiments of the present disclosure, an electronic device is provided. The electronic device includes a substrate, a light-emitting unit, and a circuit layer. The substrate has a first surface and a second surface, and the second surface is opposite the first surface. The light-emitting unit is disposed on the first surface, and the circuit layer is disposed on the second surface. The circuit layer includes a first layer and a second layer. The second layer is disposed on the first layer. The first layer includes a plurality of first wirings, the second layer includes a plurality of second wirings, and the plurality of first wirings intersect with the plurality of second wirings.

In accordance with some embodiments of the present disclosure, an electronic device is provided. The electronic device includes a substrate, a light-emitting unit, and a circuit layer. The substrate has a first surface and a second surface, and the second surface is opposite the first surface. The light-emitting unit is disposed on the first surface, and the circuit layer is disposed on the second surface. The circuit layer includes a first layer. The first layer includes a plurality of first wirings and a plurality of second wirings, and the plurality of first wirings and the plurality of second wirings are alternately arranged along a direction.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
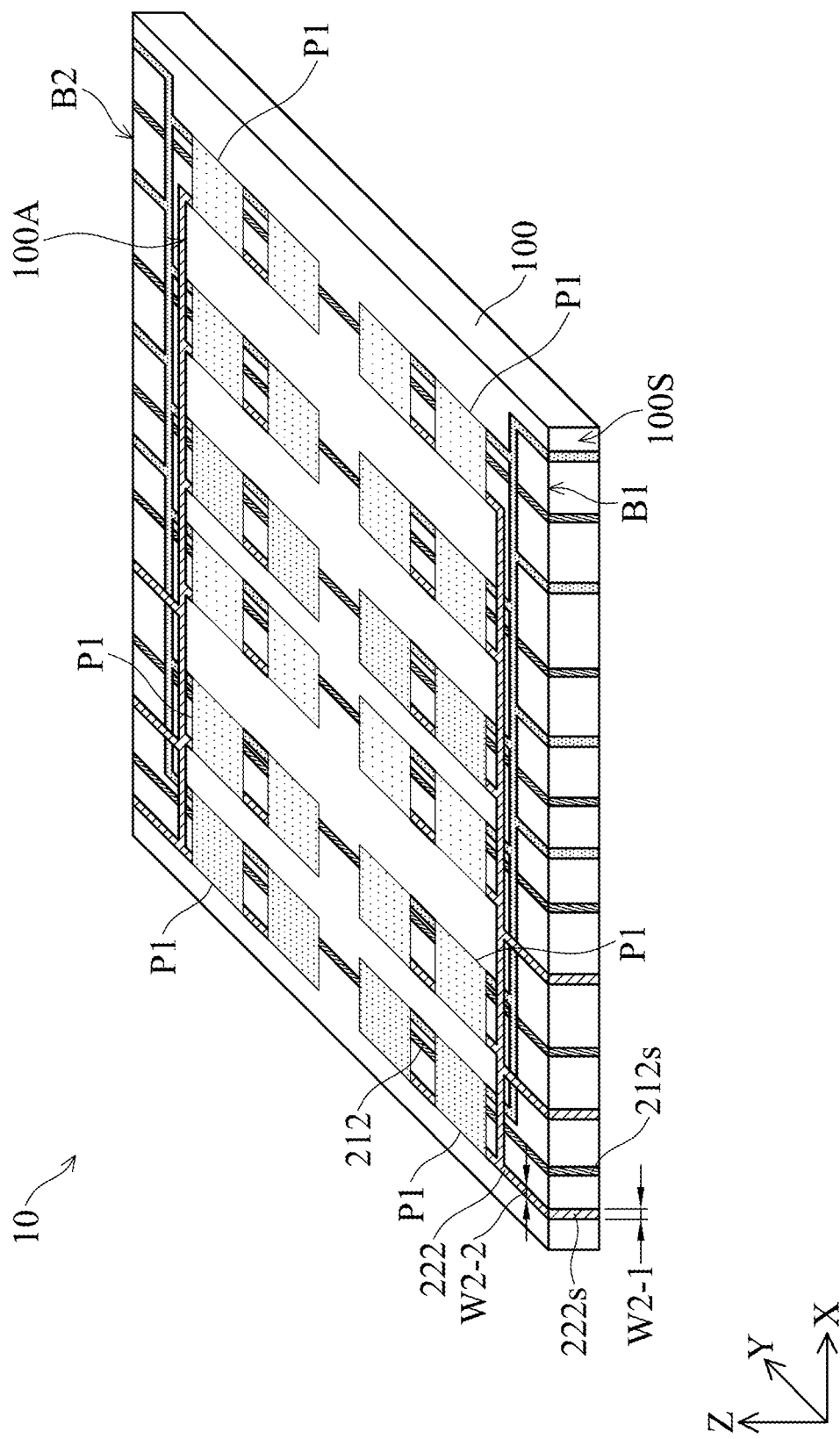
FIG. 1A is a structural diagram of some elements of an electronic device in accordance with some embodiments of the present disclosure.

The electronic device of the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

The present disclosure can be understood by referring to the following detailed description in connection with the accompanying drawings. It should be noted that in order to make it easy for readers to understand the drawings, only part of the electronic device is drawn in some of the drawings of the present disclosure, and specific elements in the drawings may be not drawn to scale. In addition, the number and size of the elements in the drawings are only for illustration, and are not intended to limit the scope of the present disclosure.

It should be understood that some of the elements or devices in the drawings of the present disclosure may be present in the form or configuration known to those skilled in the art. In addition, in the embodiments, relative expressions may be used. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. Moreover, the expressions such as "first material layer disposed on/over a second material layer", may indicate the direct contact of the first material layer and the second material layer, or it may indicate an indirect contact state with one or more intermediate layers between the first material layer and the second material layer. In the above situation, the first material layer may not be in direct contact with the second material layer.

Throughout the present disclosure and the appended claims, certain terms are used to refer to specific elements. Those skilled in the art should understand that electronic device manufacturers may refer to the same element with different names. The present disclosure does not intend to distinguish between elements that have the same function but different names. In the specification and claims, the terms "comprising", "including", "having" and the like are open-ended phrases, so they should be interpreted as "including but is not limited to . . . ". Therefore, when the terms "comprising", "including" and/or "having" are used in the description of the present disclosure, they specify the corresponding features, regions, steps, operations and/or components, but do not exclude the existence of one or more corresponding features, regions, steps, operations and/or components.

Directional terms mentioned in the present disclosure, such as "upper", "lower", "front", "rear", "left", "right", etc., are only the directions referring to the drawings. Therefore, the directional terms are used for illustration, not for limiting the present disclosure. In the drawings, each drawing depicts general features of methods, structures, and/or materials used in particular embodiments. However, these drawings should not be interpreted as defining or limiting the scope or properties encompassed by these embodiments. For example, for clarity, the relative sizes, thicknesses, and positions of the various layers, regions, and/or structures may be reduced or enlarged.

When a corresponding component (such as a layer or region) is referred to as "(disposed or located) on another component", it may be directly (disposed or located) on another component, or there may be other components between them. On the other hand, when a component is referred to as "directly (disposed or located) on another component", there is no component existing between them. In addition, when a component is referred to as "(disposed or located) on another component", the two have an upper-lower relationship from a top view, and this component may be above or below another component, and the upper-lower relationship depends on the orientation of the device.

Furthermore, it should be understood that, although the terms "first", "second", "third" etc. may be used herein to describe various elements, components, regions, layers, or portions, these elements, components, regions, layers, or portions should not be limited by these terms. These terms are only used to distinguish one element, component, region, layer, or portion from another element, component, region, layer, or portion. Thus, a first element, component, region, layer, or portion discussed below could be termed a second element, component, region, layer, or portion without departing from the teachings of the present disclosure.

In the context, the terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. When there is no specific description, the stated value includes the meaning of "about" or "substantially". In addition, the term "in a range from the first value to the second value" means that the range includes the first value, the second value, and other values in between.

It should be understood that in the following embodiments, without departing from the spirit of the disclosure, the features in several different embodiments can be replaced, recombined, and mixed to complete another embodiment. The features between the various embodiments can be mixed and matched arbitrarily as long as they do not violate or conflict the spirit of the present disclosure.

In accordance with the embodiments of the present disclosure, the thickness, length and the width of an element can be measured using an optical microscope, and the thickness of the element can be measured from a cross-sectional image obtained using an electron microscope, but it is not limited thereto. In addition, certain errors may exist between any two values or directions used for comparison. If the first value is equal to the second value, it may imply that there may be an 10% error between the first value and the second value; if the first direction is perpendicular to the second direction, the angle between the first direction and the second direction may be between 80 degrees and 100 degrees; and if the first direction is parallel to the second direction, the angle between the first direction and the second direction may be between 0 degree and 10 degrees.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, an electronic device is provided. With the layout design of the circuit layer of the electronic device, the distribution uniformity of the signals (such as the power signals) transmitted to the light-emitting units may be improved. In addition, the heat accumulation or power dissipation caused by the excessive gathering of the signal lines may be reduced. The display quality of the electronic device thereby may be improved, for example, the problems of uneven image brightness may be improved.

In accordance with some embodiments of the present disclosure, the electronic device may include a display device, a light-emitting device, a touch device, a sensing device, a tiled device, or a combination thereof, but it is not limited thereto. The electronic device may include a bendable or flexible electronic device. In some embodiments, the electronic device may include light-emitting diode (LED), liquid crystal, fluorescence, phosphor, quantum dot (QD), other suitable medium material, or a combination thereof, but it is not limited thereto. The light-emitting diode may include, for example, an organic light-emitting diode (OLED), an inorganic light-emitting diode, a mini light-emitting diode (mini LED), and a micro light-emitting diode (micro LED) or quantum dot light-emitting diode (for example, QLED or QDLED), other suitable materials, or a combination thereof, but it is not limited thereto. In addition, the electronic device may be rectangular, circular, polygonal, irregular, a shape with curved edges, or other suitable shapes. The electronic device may have peripheral systems such as a driving system, a control system, a light source system, or a shelf system to support a display device. In the following context, a display device will be used as an example to describe the electronic device, but the present disclosure is not limited thereto.

Figure 1B:
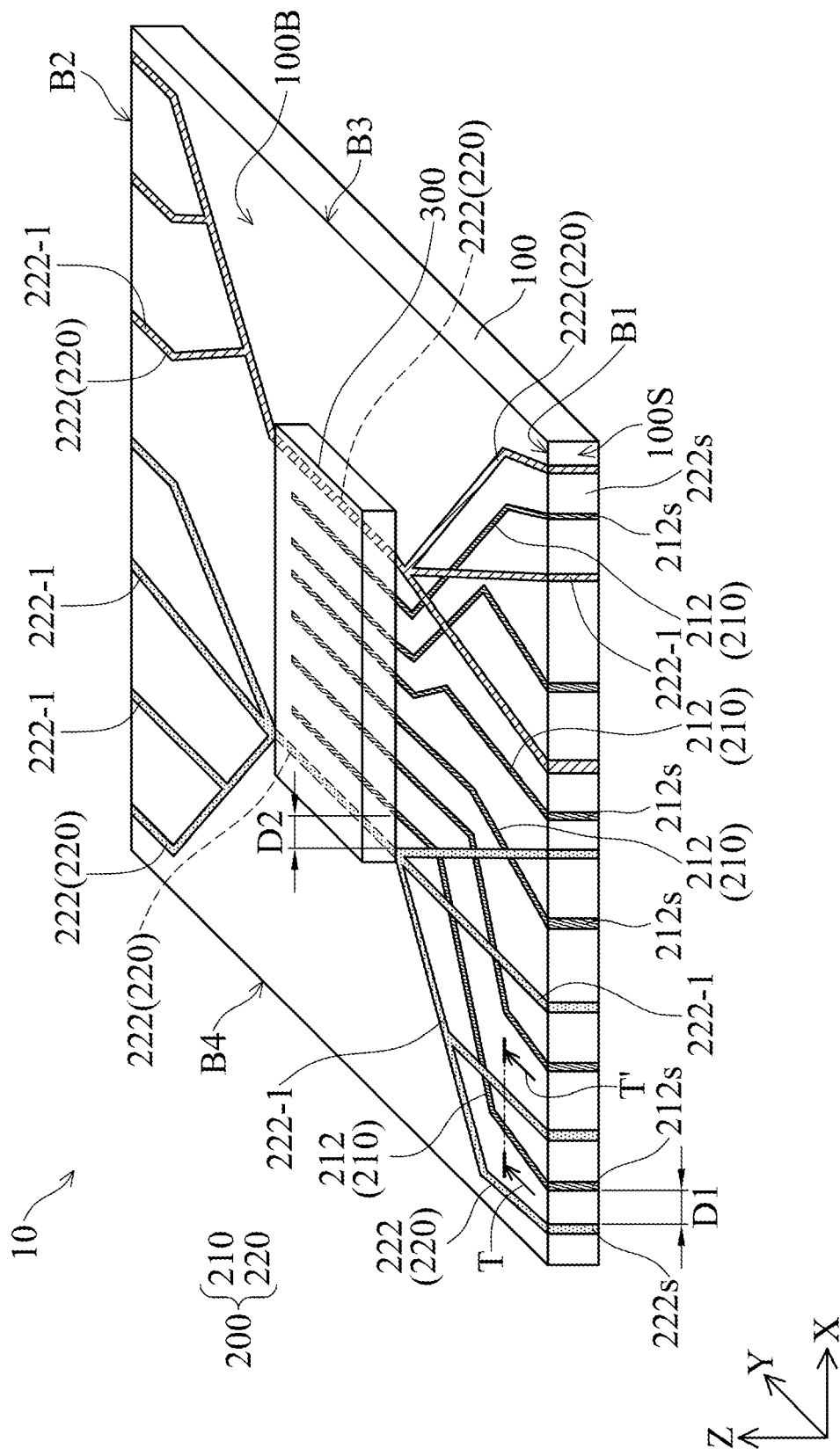
FIG. 1B is a structural diagram of some elements of an electronic device in accordance with some embodiments of the present disclosure.

Refer to FIG. 1A and FIG. 1B, which are structural diagrams of some elements of an electronic device 10 in accordance with some embodiments of the present disclosure. It should be understood that, for clear description, some elements of the electronic device 10 are omitted in the drawing, and only some elements are schematically shown. In some embodiments, additional features may be added to the electronic device 10 described below. In some other embodiments, some of the features of the electronic device 10 described below may be replaced or omitted.

As shown in FIG. 1A and FIG. 1B, the electronic device 10 may include a substrate 100. The substrate 100 may have a first surface 100A and a second surface 100B, and the second surface 100B may be opposite the first surface 100A. That is, the first surface 100A and the second surface 100B may be the surfaces on opposite sides of the substrate 100. Furthermore, the substrate 100 may have a side surface 100S, and the side surface 100S may be connected to the first surface 100A and the second surface 100B. In some embodiments, the electronic device 10 may have a plurality of light-emitting units P1, and the light-emitting units P1 may be disposed on the first surface 100A. The plurality of light-emitting units P1 may define an active area (e.g., a display area or a light-emitting area). For example, the first surface 100A may face an observer. The electronic device 10 may include a circuit layer 200, and the circuit layer 200 may be disposed on the second surface 100B.

In some embodiments, the substrate 100 may include a flexible substrate, a rigid substrate, or a combination thereof, but is not limited thereto. In some embodiments, the material of the substrate 100 may include glass, quartz, sapphire, ceramic, polyimide (PI), polycarbonate (PC), polyethylene terephthalate (PET), polypropylene (PP), other suitable materials or a combination thereof, but it is not limited thereto.

In some embodiments, the light-emitting unit P1 may include a light-emitting diode. For example, the light-emitting unit P1 may include an organic light-emitting diode, an inorganic light-emitting diode such as a mini light-emitting diode, a micro light-emitting diode, or a quantum dot light-emitting diode (QLED, or QDLED), or a combination thereof, but it is not limited thereto.

As shown in FIG. 1B, in some embodiments, the circuit layer 200 may include a first layer 210 and a second layer 220. The second layer 220 may be disposed on the first layer 210. The first layer 210 may include a plurality of first wirings 212, the second layer 220 may include a plurality of second wirings 222, and the first wirings 212 may be intersected with the second wirings 222. In some embodiments, in a normal direction Z of the substrate 100, the first wirings 212 may partially overlap or intersect with the second wirings 222. In some embodiments, the plurality of first wirings 212 may be used to provide data signals or scan signals, and the plurality of second wirings 222 may be used to provide power signals. Specifically, in some embodiments, the first wiring 212 may be a data line or a scan line, and the second wiring 222 may be a power signal line that transmits an operating voltage (VDD) or a common ground voltage (VSS), but they are not limited thereto.

As shown in FIG. 1B, in some embodiments, the electronic device 10 may include a driving element 300. The driving element 300 may be disposed on the second surface 100B and electrically connected to the first wirings 212 and the second wirings 222. In some embodiments, the driving element 300 may include an integrated circuit (IC), a microchip, etc. to control the driving element, but it is not limited thereto.

In some embodiments, the driving element 300 may be disposed on the second surface 100B of the substrate 100 in the manner of chip on film (COF) or chip on glass (COG), but it is not limited thereto. Furthermore, the number of the driving element 300 is not limited to that illustrated in the drawing. According to different embodiments, the electronic device 10 may have any suitable number of driving elements 300.

As shown in FIG. 1B, in some embodiments, the second wiring 222 may have a plurality of branch wirings, and the first wiring 212 may not have branch wirings. In some embodiments, the second surface 100B of the substrate 100 may have a side B1, a side B2, a side B3, and/or a side B4, the side B1 may be opposite the side B2, and the side B3 may be opposite the side B4. In some embodiments, the first wirings 212 may extend from the side B1 at least to the bottom surface of the driving element 300 (i.e. the surface of the driving element 300 that faces the substrate 100), but may not extend to the side B2 that is opposite the side B1, but it is not limited thereto. In some embodiments, the second wirings 222 may extend from the side B1 to the bottom surface of the driving element 300 (i.e. the surface of the driving element 300 that faces the substrate 100), and may optionally extend to the side B2 that is opposite the side B1, but it is not limited thereto. In addition, in some embodiments (not illustrated), the second wirings 222 may extend to the side B3 and/or the side B4, but it is not limited thereto.

In some embodiments, the second wiring 222 may have a plurality of branch wirings 222-1, and the plurality of branch wirings 222-1 may converge and extend to the bottom surface of the driving element 300, and the second wiring 222 may be electrically connected to the driving element 300 through the corresponding electrode pad (not illustrated). In some embodiments, at least two second wirings 222 corresponding to the bottom surface of the driving element 300 may be located between the plurality of first wirings 212, but it is not limited thereto. In some other embodiments (not illustrated), the second wirings 222 and the first wirings 212 corresponding to the bottom surface of the driving element 300 may be configured in other manners. In some embodiments, the number of second wirings 222 corresponding to the bottom surface of the driving element 300 and the number of first wirings 212 corresponding to the bottom surface of the driving element 300 may be the same or different. For example, in some embodiments (as shown in FIG. 1B), the number of the second wirings 222 under the bottom surface of the driving element 300 may be less than the number of the first wirings 212. In some embodiments (as shown in FIG. 1B), two second wirings 222 may be disposed corresponding to the bottom surface of the driving element 300, one may be used to transmit the operating voltage (VDD), and the other may be used to transmit the common ground voltage (VSS), but it is not limited thereto. In some embodiments, the signals transmitted by the second wirings 222 may be adjusted according to need. In some embodiments, the second wiring 222 corresponding to the bottom surface of the driving element 300 may extend toward the side B1 and/or the side B2 and separate into a plurality of branch wirings 222-1, but it is not limited thereto. In some other embodiments, the number of branch wirings 222-1 of the second wiring 222 may be more or less than that shown in FIG. 1B.

As shown in FIG. 1B, in some embodiments, the electronic device 10 may include a plurality of first side circuits 212s and a plurality of second side circuits 222s. The first side circuits 212s may be disposed on the side surface 100S of the substrate 100, and each of the first side circuits 212s may be electrically connected to a respective first wiring 212. The second side circuits 222s may be disposed on the side surface 100S of the substrate 100, and each of the second side circuits 222s may be electrically connected to a respective second wiring 222. In addition, the first side circuits 212s and the second side circuits 222s may not overlap. In some embodiments, the second side circuits 222s may be electrically connected to the branch wiring 222-1 of the second wiring 222.

In some embodiments, the first side circuits 212s and the second side circuits 222s may be electrically connected to the circuits disposed on the first surface 100A of the substrate 100. FIG. 1A does not fully illustrate the wirings disposed on the first surface 100A of the substrate 100. However, it should be understood that, in some embodiments, the wirings disposed on the first surface 100A may be electrically connected to the light-emitting units P1, and may be electrically connected to the first wirings 212 and the second wirings 222 of the circuit layer 200 through the first side circuits 212s and/or the second side circuits 222s.

In some embodiments, the first side circuits 212s and the second side circuits 222s disposed on the side surface 100S may extend substantially along the normal direction Z of the substrate 100, but it is not limited thereto. In some embodiments, the first side circuits 212s and the second side circuits 222s disposed on the side surface 100S may be substantially parallel to each other, and the first side circuits 212s and the second side circuits 222s may be alternately arranged in a direction X, but it is not limited thereto. The direction X may be, for example, a direction perpendicular to the normal direction of the side surface 100S, and the direction may be substantially a longitudinal direction of the side surface 100S. In some embodiments, in the direction X, one of the plurality of first side circuits 212s may be adjacent to one of the plurality of second side circuits 222s, and they may be separated by a first distance D1. For example, the first distance D1 may be the minimum distance between the first side circuit 212s and the second side circuit 222s. In some embodiments, first distance D1 may be in a range from 50 micrometers (μm) to 300 micrometers (50 μm≤first distance≤D1≤300 μm), but it is not limited thereto. In some embodiments, the first distance D1 may be in a range from 70 μm to 250 μm (70 μm≤first distance D1≤250 μm). In some embodiments, the first distance D1 may be in a range from 100 μm to 200 μm (100 μm≤first distance D1≤200 μm).

In addition, in the direction X, the first wiring 212 and the second wiring 222 that correspond to or overlap the bottom surface of the driving element 300 may be separated by a second distance D2. The second distance D2 may be the minimum distance between the first wiring 212 and the second wiring 222 that correspond to or overlap the bottom surface of the driving element 300.

In accordance with the embodiments of the present disclosure, an optical microscopy (OM), a scanning electron microscope (SEM), a film thickness profiler (α-step), an ellipsometer or other suitable methods may be used to measure the distance or pitch between elements, or the thickness or width of the element. Specifically, in some embodiments, a scanning electron microscope may be used to obtain a cross-sectional image including the elements to be measured, and the distance or pitch between elements, or the thickness or width of the element in the image can be measured.

In some embodiments, the materials of the first wirings 212, the second wirings 222, the first side circuits 212s, and the second side circuits 222s may include metal conductive materials, transparent conductive materials, other suitable materials, or the a combination thereof, but it is not limited thereto. The metal conductive material may include copper (Cu), silver (Ag), gold (Au), tin (Sn), aluminum (Al), molybdenum (Mo), tungsten (W), chromium (Cr), nickel (Ni), platinum (Pt), titanium (Ti), alloy of any of the foregoing metal, other suitable materials, or a combination thereof, but it is not limited thereto. The transparent conductive material may include transparent conductive oxide (TCO), for example, indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), other suitable transparent conductive materials, or a combination thereof, but it is not limited thereto. In some embodiments, the first wiring 212, the second wiring 222, the first side circuit 212s, and the second side circuit 222s may be, for example, a single-layer structure or a multi-layer structure. In some embodiments, the materials of the first wiring 212, the second wiring 222, the first side circuit 212s, and the second side circuit 222s may be the same, different from one another, or some of them may be the same and some of them may be different.

In some embodiments, a screen printing process, an ink jet printing process, a chemical vapor deposition process, a physical vapor deposition process, an electroplating process, an electroless plating process, other suitable processes or a combination thereof may be used to form the first wirings 212, the second wirings 222, the first side circuits 212s and/or the second side circuits 222s. In some embodiments, one or more photolithography processes and/or etching processes may be used to pattern the first wirings 212, the second wirings 222, the first side circuits 212s, and the second side circuits 222s. In some embodiments, the photolithography process may include photoresist coating (e.g., spin coating), soft baking, hard baking, mask alignment, exposure, post-exposure baking, photoresist development, cleaning and drying, etc., but it is not limited thereto. The etching process may include a dry etching process or a wet etching process, but it is not limited thereto.

Furthermore, the first wirings 212 and the second wirings 222 may be formed in the same or different manufacturing processes, and the first side circuits 212s and the second side circuits 222s may be formed in the same or different manufacturing processes. In addition, the process of forming the first wirings 212 and the second wirings 222 and the process of forming the first side circuits 212s and the second side circuits 222s may be performed simultaneously or separately.

It should be noted that, compared to the configuration manner that the wirings are disposed on a single side (that is, the second side circuits 222s are disposed on only one side (e.g., side B1)), the configuration manner that the second side circuits 222s are disposed on multiple sides (as shown in FIG. 1B, for example, the second wirings 222 under the bottom surface of the driving element 300 may extend in different directions, extend toward the side B1 and the side B2 and separate into a plurality of branch wirings 222-1, and may be electrically connected to the second side circuits 222s disposed on the side B1 and/or the side B2 through the branch wirings 222-1) allows the power signals transmitted by the second wirings 222 to be transmitted to the second side circuits 222s located on the different sides in a more uniform or dispersed manner. With these second side circuits 222s, the power signals can be transmitted to the light-emitting units P1 in a multi-terminal manner, but it is not limited thereto. As shown in FIG. 1A, the power signals transmitted by the second wirings 222 can be respectively transmitted to different light-emitting units P1 through the second side circuits 222s disposed on the side B1 and/or the second side circuit 222s (not illustrated) disposed on the side B2. In this way, the heat accumulation or power dissipation caused by the excessive gathering of signal lines can be reduced. For example, as shown in FIG. 1A, the electronic device 10 may have a plurality of light-emitting units P1. These light-emitting units P1 may be divided into an upper part and a lower part. For example, the second side circuits 222s disposed on the side B1 may transmit different power signals (such as VDD or VSS) to the part of the light-emitting units P1 corresponding to the lower part, while the second side circuits 222s disposed on the side B2 may transmit different power signals (such as VDD or VSS) to the part of the light-emitting units P1 corresponding to the upper part, but it is not limited thereto. In some other embodiments (not illustrated), the plurality of light-emitting units P1 may be divided in parts in other manners, and the second side circuits 222s located on different sides may respectively transmit power signals to the light-emitting units P1 located in different parts. It should be noted that the circuit configuration on the first surface 100A shown in FIG. 1A is merely a simple illustration, and some electronic elements (for example, transistors, capacitors, scan lines, data lines, or other electronic elements etc.) are omitted between the circuits. In some other embodiments, the connection relationship between the circuits and the light-emitting units P1 disposed on the first surface 100A may be adjusted according to need. It should be noted that the second side circuit 222s or the second wiring 222 that transmit different power signals should be electrically insulated from each other. For example, when the second side circuit 222s or the second wiring 222 that transmit different power signals belong to the same conductive layer, they do not overlap in the circuit design. For example, when the second side circuit 222s or the second wiring 222 that transmit different power signals belong to different conductive layers, these different conductive layers may be separated by the dielectric layer to reduce the problem of short circuit.

It should be understood that the numbers of the first wirings 212, the second wirings 222, the first side circuits 212s and the second side circuits 222s in the circuit layer 200 are not limited to those shown in the drawing. According to different embodiments, the electronic device 10 may have other suitable numbers of the first wirings 212, the second wirings 222, the first side circuits 212s and the second side circuits 222s.

Figure 2A:
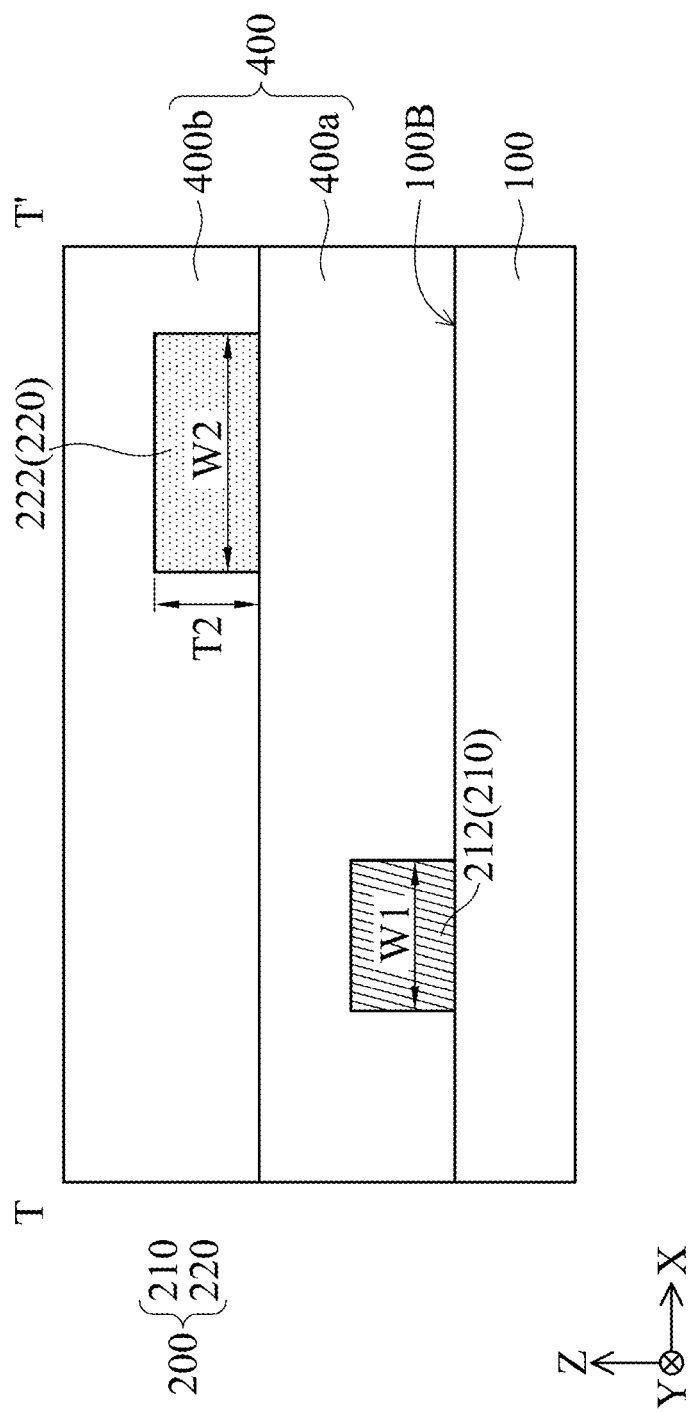
FIG. 2A is a cross-sectional diagram of an electronic device corresponding to section line T-T' of FIG. 1B in accordance with some embodiments of the present disclosure.
Figure 2B:
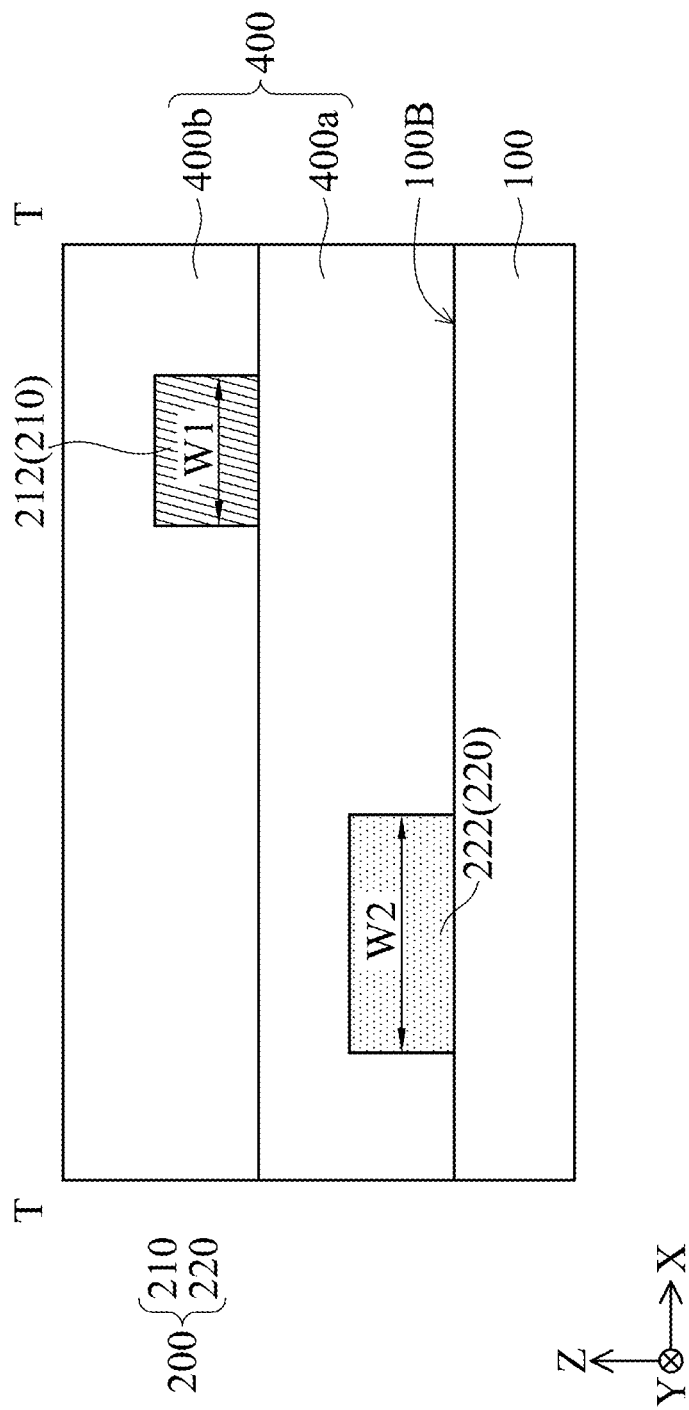
FIG. 2B is a cross-sectional diagram of an electronic device corresponding to section line T-T' of FIG. 1B in accordance with some embodiments of the present disclosure.

Next, refer to FIG. 2A and FIG. 2B, which are cross-sectional diagrams of the electronic device 10 corresponding to the section line T-T' of FIG. 1B in accordance with some embodiments of the present disclosure. It should be understood that, for clear description, FIG. 2A and FIG. 2B only illustrate the first layer 210 and the second layer 220 of the circuit layer 200, and the protective layer 400, and other elements are omitted. The first layer 210 and the second layer 220 illustrated in the cross-sectional diagram have a single-layer structure, but the first layer 210 and the second layer 220 may optionally have a single-layer or multi-layer structure according to need.

As shown in FIG. 2A and FIG. 2B, in some embodiments, the electronic device 10 includes a protective layer 400 that covers the circuit layer 200. In some embodiments, the protective layer 400 may be disposed on the second surface 100B of the substrate 100. However, in order to make FIG. 2A more clear, the protective layer 400 is omitted and not shown in FIG. 2A. The protective layer 400 can be referred to that shown in FIG. 2B. Specifically, the protective layer 400 may include at least one sublayer. For example, the protective layer 400 may include a first sublayer 400a and a second sublayer 400b. The first sublayer 400a may cover the first layer 210 of the circuit layer 200 (e.g., a plurality of first wirings 212). The second sublayer 400b may cover the second layer 220 of the circuit layer 200 (e.g., a plurality of second wirings 222). In addition, the first layer 210 and the second layer 220 belong to different layers of the circuit layer 200, but it is not limited thereto. In some embodiments (as shown in the following FIG. 3), the protective layer 400 may be disposed on the first side circuits 212s and the second side circuits 222s.

In some embodiments, the protective layer 400 may be used to protect the first wirings 212 and the second wirings 222, and reduce the risk of moisture or oxygen to cause corrosion of the first wirings 212 and/or the second wirings 222. In some embodiments, the protective layer 400 may include organic materials, inorganic materials, other suitable protective materials, or a combination thereof, but it is not limited thereto. In some embodiments, the aforementioned inorganic material may include silicon nitride, silicon oxide, silicon oxynitride, aluminum oxide, or other suitable materials, but it is not limited thereto. In some embodiments, the aforementioned organic material may include epoxy resins, silicone resins, acrylic resins (e.g., polymethylmetacrylate (PMMA), benzocyclobutene (BCB), polyimide, polyester, polydimethylsiloxane (PDMS), polyfluoroalkoxy (PFA), other suitable materials, or a combination thereof, but it is not limited thereto. Furthermore, the material of the first sublayer 400a of the protective layer 400 may be the same as or different from the material of the second sublayer 400b. In some embodiments, the material of the first sublayer 400a may have dielectric properties, which may reduce the risk of short circuit between the first wirings 212 and the second wirings 222.

In addition, as shown in FIG. 2A, in some embodiments, the second layer 220 of the circuit layer 200 may be disposed on the first layer 210. That is, the second wirings 222 may be disposed on the first wirings 212. In some embodiments, as shown in FIG. 2B, the first layer 210 of the circuit layer 200 may be disposed on the second layer 220. That is, the first wirings 212 may be disposed on the second wirings 222.

In some embodiments, one of the plurality of first wirings 212 may have a first width W1, and one of the plurality of second wirings 222 may have a second width W2, and the second width W2 may be greater than or equal to the first width W1 (the second width W2≥the first width W1). The first width W1 is defined as the maximum width of the first wiring 212 in the direction X, and the second width W2 is defined as the maximum width of the second wiring 222 in the direction X. In some embodiments, the width of one of the plurality of second wirings 222 located on the second surface 100B of the substrate 100 (i.e. the second width W2) or a width W2-1 of the second side circuit 222s located on the side surface 100S (referring to the maximum width of the second side circuit 222s in the direction X in FIG. 1A) may be greater than or equal to a width W2-2 of the second wiring 222 on the first surface 100A of the substrate 100 (referring to the maximum width of the second wiring 222 in the direction X), but it is not limited thereto. In some embodiments, a thickness T2 of the second wiring 222 on the second surface 100B of the substrate 100 or the thickness (not illustrated) of the second side circuit 222s may be greater than or equal to the thickness (not illustrated) of the second wiring 222 on the first surface 100A of the substrate 100, but it is not limited thereto. When the width (or thickness) of the second wiring 222 on the second surface 100B or the second side circuit 222s is greater than the width (or thickness) of the second wiring 222 on the first surface 100A, the resistance of the second wiring 222 located on the second surface 100B or the second side circuit 222s can be reduced, or the power dissipation can be reduced.

Figure 3:
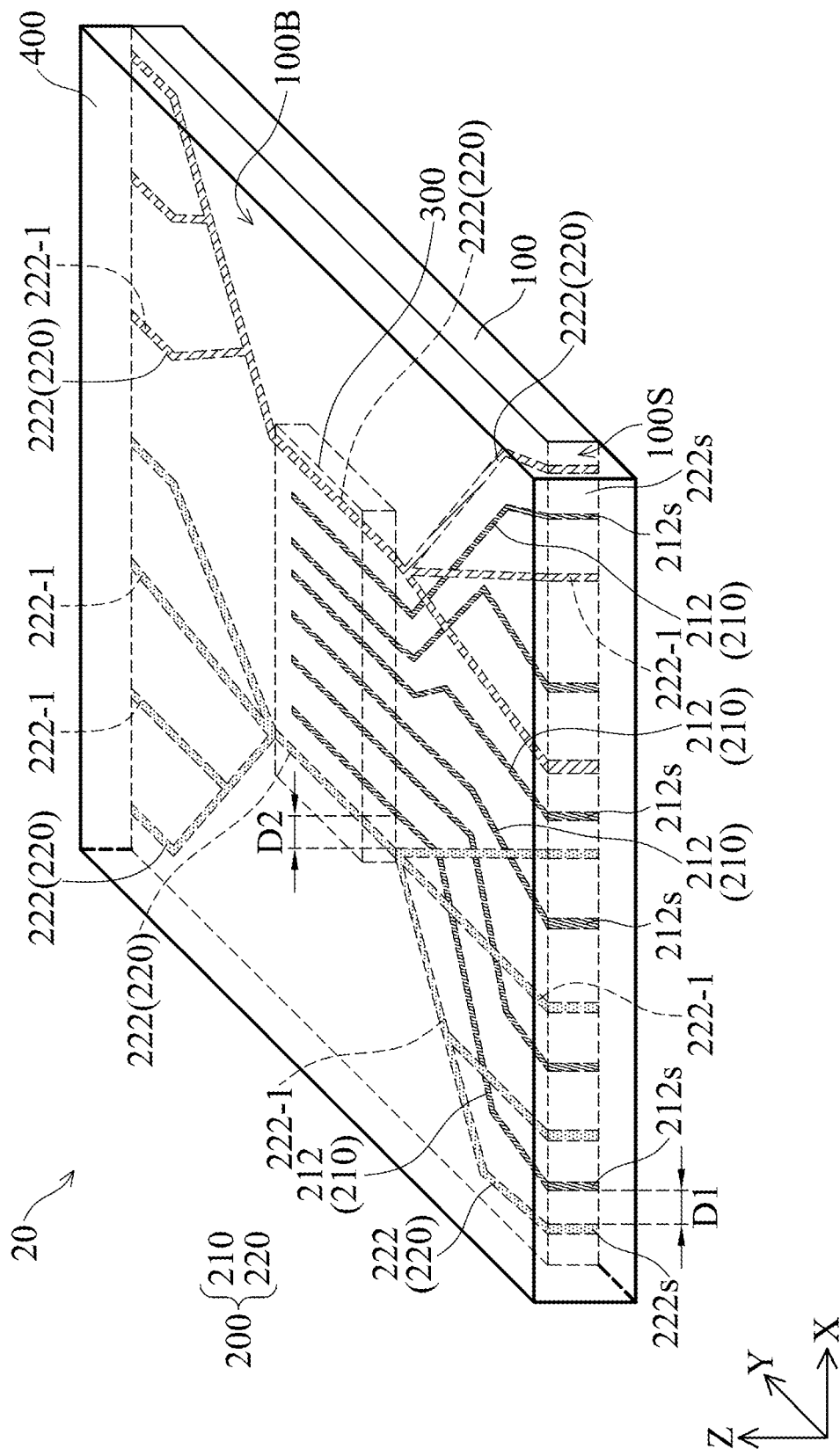
FIG. 3 is a structural diagram of some elements of an electronic device in accordance with some embodiments of the present disclosure.

Next, refer to FIG. 3, which is a structural diagram of some elements of an electronic device 20 in accordance with some other embodiments of the present disclosure. It should be understood that the same or similar components (or elements) in the following paragraph will be denoted by the same or similar reference numbers, and their materials, manufacturing methods and functions are the same or similar to those described above, and thus they will not be repeated in the following context.

The electronic device 20 shown in FIG. 3 is substantially similar to the electronic device 10 shown in FIG. 1B. The difference between them includes that the protective layer 400 of the electronic device 20 may be disposed on the side surface 100S of the substrate 100, and the protective layer 400 may cover a plurality of first side circuits 212s and a plurality of second side circuits 222s. In some embodiments, the protective layer 400 may cover the circuit layer 200, the first side circuit 212s and/or the second side circuit 222s, but it is not limited thereto. In some embodiments, the protective layer 400 may be at least partially disposed on the driving element 300.

In some embodiments, the first side circuits 212s and/or the second side circuits 222s disposed on the side surface 100S of the substrate 100 may be in contact with the side surface 100S. In some embodiments, the first side circuits 212s and the second side circuits 222s may be located in the same layer, and the protective layer 400 may cover the first side circuits 212s and the second side circuits 222s, but it is not limited thereto. In some embodiments, the protective layer 400 disposed on the side surface 100S may have a first sublayer (not illustrated) and a second sublayer (not illustrated), and the first sublayer may cover the first side circuits 212s, the second sublayer may cover the second side circuits 222s, but it is not limited thereto.

Figure 4:
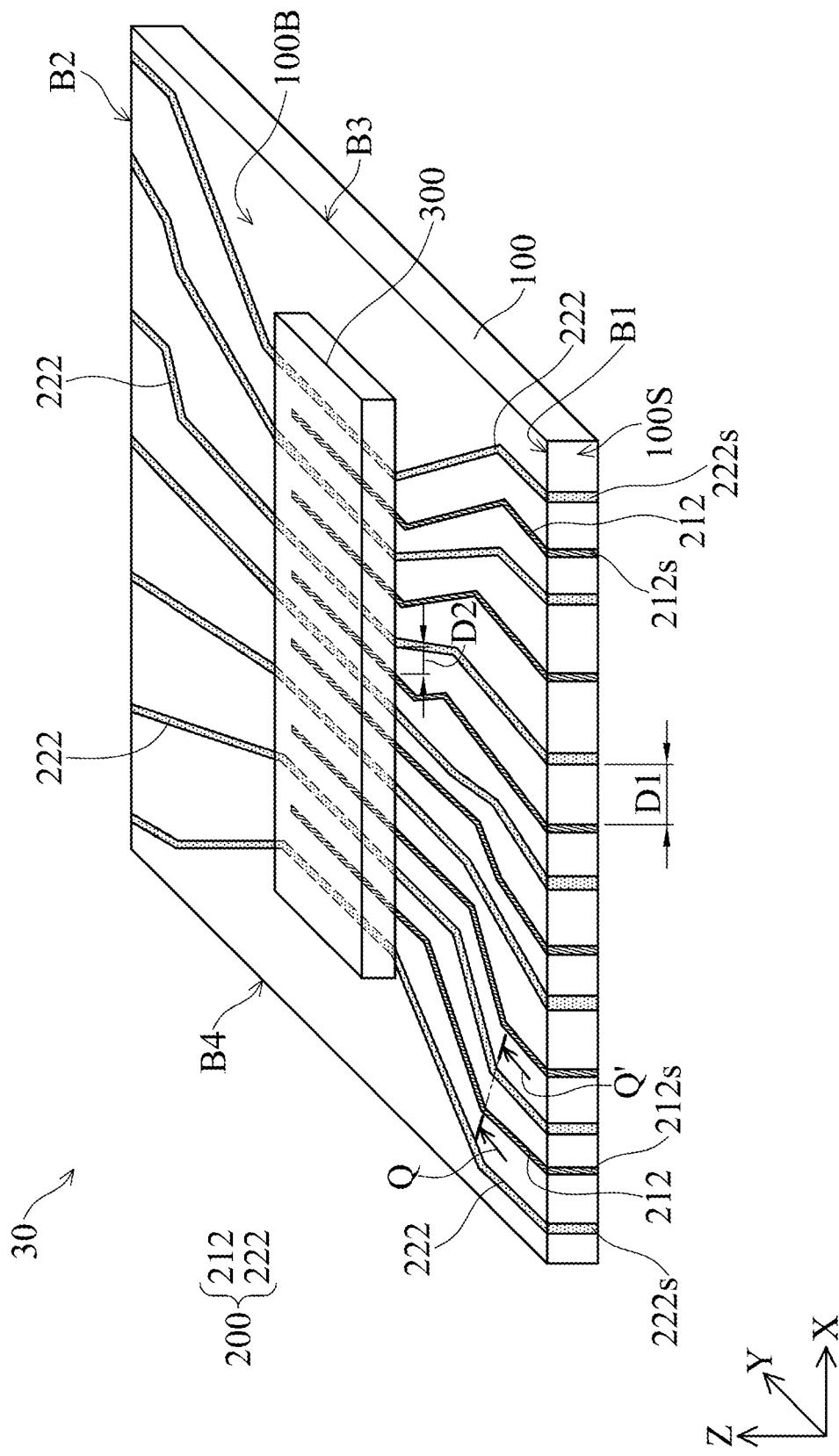
FIG. 4 is a structural diagram of some elements of an electronic device in accordance with some embodiments of the present disclosure.

Next, refer to FIG. 4, which is a structural diagram of some elements of an electronic device 30 in accordance with some other embodiments of the present disclosure. As shown in FIG. 4, in some embodiments, the circuit layer 200 of the electronic device 30 may include a plurality of first wirings 212 and a plurality of second wirings 222, and the first wirings 212 and the second wirings 222 may not overlap, or they may not be alternately arranged along the direction X. Specifically, in the normal direction Z of the substrate 100, the first wirings 212 and the second wirings 222 may not overlap. In addition, the first side circuits 212s and the second side circuits 222s disposed on the side surface 100S of the substrate 100 also may not overlap. In some embodiments, the first side circuits 212s and the second side circuits 222s disposed on the side surface 100S may be substantially parallel to each other, but it is not limited thereto. In some embodiments, the plurality of first side circuits 212s and the plurality of second side circuits 222s may be alternately arranged along the direction X.

It should be understood that in the illustrated embodiment, the first side circuit 212s and the second side circuit 222s are alternately arranged in a one-to-one manner (that is; one first side circuit 212s, followed by one second side circuit 222s, followed by one first side circuit 212s, etc. . . . ). However, in some other embodiments, the first side circuits 212s and the second side circuits 222s can be alternately arranged in any other suitable number and manner. For example, the first side circuit 212s and the second side circuit 222s may be alternately arranged in a one-to-many manner (that is; one first side circuit 212s, followed by multiple second side circuits 222s, followed by one first side circuit 212s, etc. . . . ), or alternately arranged in a many-to-one manner (that is; multiple first side circuits 212s, followed by one second side circuit 222s, followed by multiple first side circuits 212s, etc. . . . ), or alternately arranged in a many-to-many manner, but the present disclosure is not limited thereto.

As shown in FIG. 4, in some embodiments, the second wirings 222 may not have branch wirings, and the second wirings 222 may extend from the side B1 of the substrate 100 to the side B2. In other words, the second wiring 222 extending from the side B1 to the bottom surface of the driving element 300 may be electrically connected to the second wiring 222 extending from the side B2 to the driving element 300.

The circuit configuration shown in FIG. 4 can also enable the power signals transmitted by the second wirings 222 to be transmitted to the second side circuits 222s located on different sides in a more uniform or dispersed manner. With these second side circuits 222s, the power signals can be transmitted to the light-emitting units P1 in a multi-terminal manner.

Figure 5:
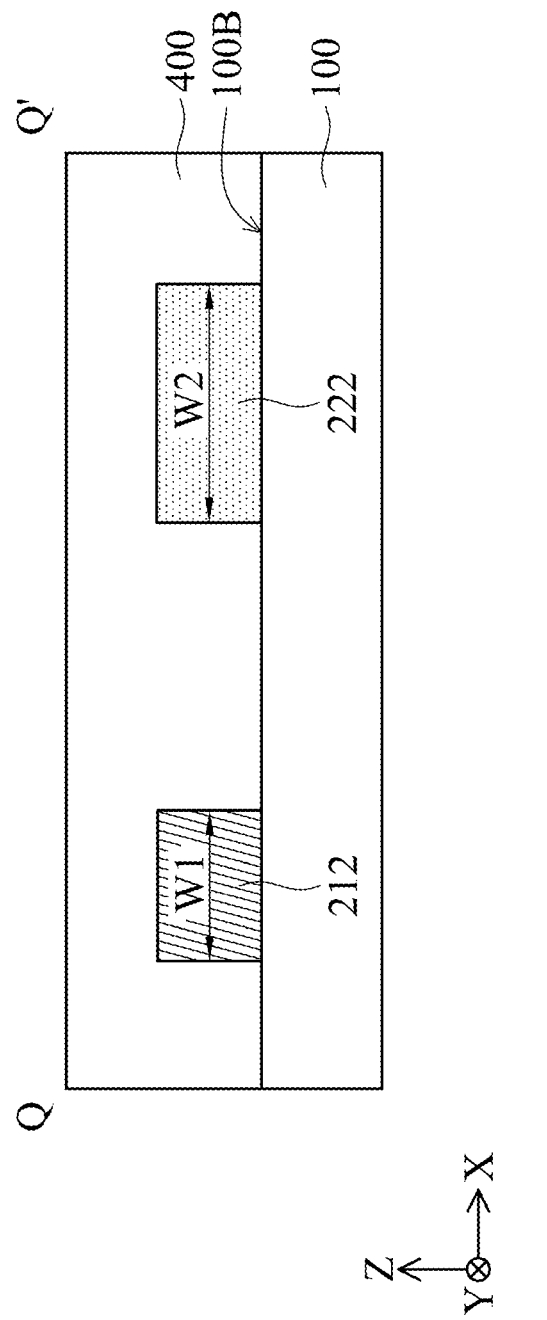
FIG. 5 is a cross-sectional diagram of an electronic device corresponding to section line Q-'Q of FIG. 4 in accordance with some embodiments of the present disclosure.

Next, refer to FIG. 5, which is a cross-sectional diagram of the electronic device 30 corresponding to the section line Q-'Q of FIG. 4 in accordance with some embodiments of the present disclosure. It should be understood that, for clear description, FIG. 5 only illustrates the first wiring 212 and the second wiring 222 of the circuit layer 200, and the protective layer 400, and other elements are omitted.

As shown in FIG. 5, in some embodiments, the protective layer 400 may have a single-layer structure, and the plurality of second wirings 222 and the plurality of first wirings 212 belong to the same layer. In some embodiments, the second wirings 222 and the first wirings 212 may be in contact with the second surface 100B of the substrate 100, and the protective layer 400 may cover the first wirings 212 and the second wirings 222. In this embodiment, the first side circuits 212s and the second side circuits 222s may be in contact with the side surface 100S of the substrate 100. That is, the first side circuits 212s and the second side circuits 222s may be located in the same layer. Furthermore, in this embodiment, the first wirings 212 and the second wirings 222 may be formed in the same manufacturing process, the first side circuits 212s and the second side circuits 222s may be formed in the same or different manufacturing processes. In addition, the process of forming the first wirings 212 and the second wirings 222 and the process of forming the first side circuits 212s and the second side circuits 222s may be performed simultaneously or separately.

Figure 6:
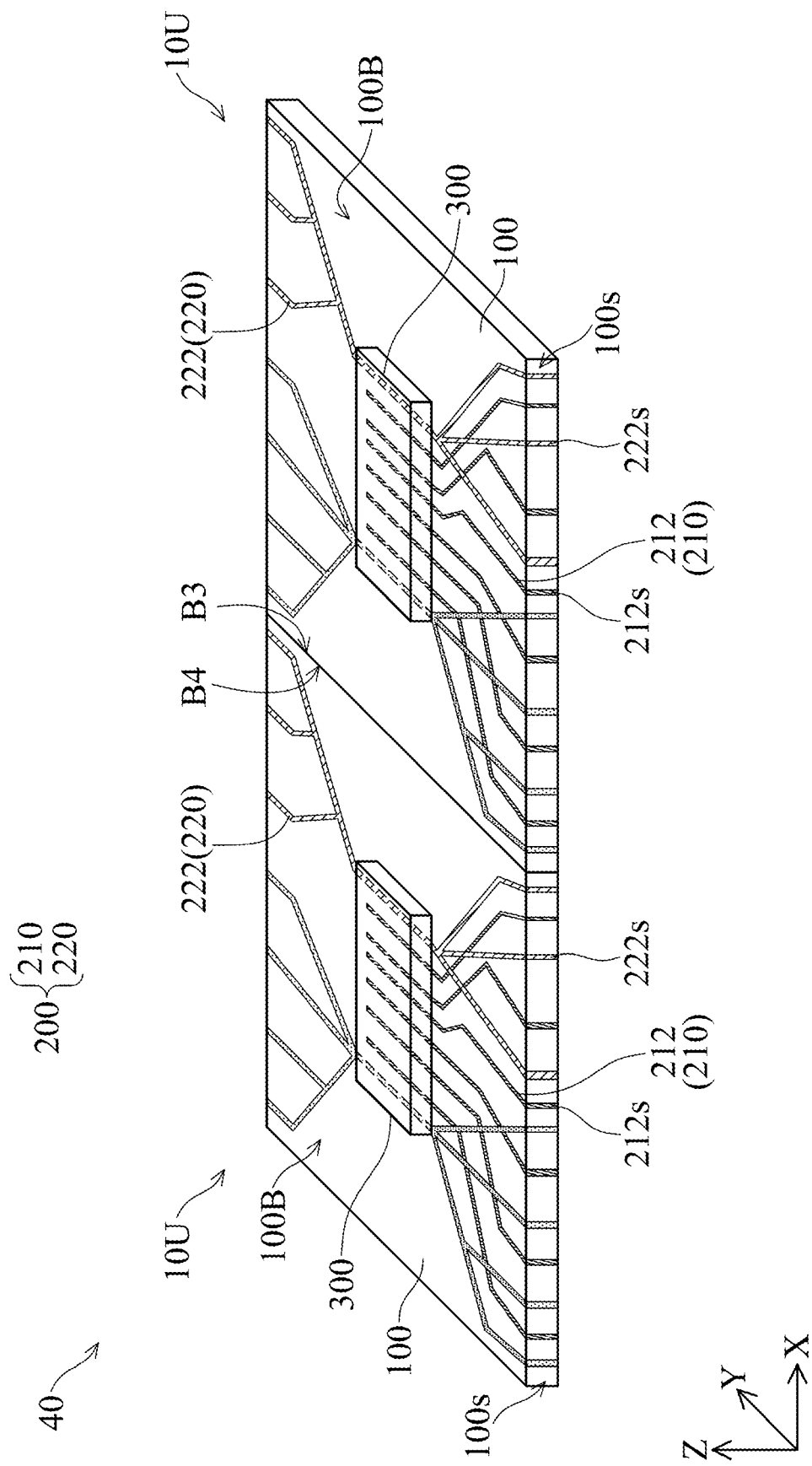
FIG. 6 is a structural diagram of some elements of a tiled electronic device in accordance with some embodiments of the present disclosure.

Next, refer to FIG. 6, which is a structural diagram of some elements of a tiled electronic device 40 in accordance with some other embodiments of the present disclosure. As shown in FIG. 6, the tiled electronic device 40 may include electronic devices 10U that are tiled adjacent to each other, and the structure of the electronic device 10U may be the same as or similar to the electronic device described in any of the foregoing embodiments or a combination thereof. In some embodiments, there may be optionally no wiring disposed on the side B3 and the side B4 of the substrate 100, so that joining of the substrates 100 of two adjacent electronic devices 10U may be facilitated. For example, the side B4 of the substrate 100 of the electronic device 10U illustrated on the left may be joined to the side B3 of the substrate 100 of the electronic device 10U illustrated on the right. The gap between the joint position of the two electronic devices 10U may be reduced, and the interference to the image display quality due to the gaps at the joint position may be reduced, but it is not limited thereto. According to different embodiments, the tiled electronic device 40 may have any suitable number of electronic devices 10U, and may be tiled in other suitable ways.

To summarize the above, in accordance with some embodiments of the present disclosure, in the electronic device provided, with the layout design of the channels of circuit and/or driving element, the distribution uniformity of the circuits (such as the power signal lines) in the active area can be improved. Accordingly, the heat accumulation or power dissipation caused by the excessive current density may be reduced, or the display quality of the electronic device thereby may be improved, for example, the problems of uneven image brightness may be improved.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
   a substrate having a first surface and a second surface, wherein the second surface is opposite the first surface;
   a light-emitting unit disposed on the first surface; and
   a circuit layer disposed on the second surface, wherein the circuit layer comprises a first layer and a second layer, the second layer is disposed on the first layer, the first layer comprises a plurality of first wirings, the second layer comprises a plurality of second wirings, and the plurality of first wirings intersect with the plurality of second wirings,
   wherein the plurality of first wirings are used to provide data signal or scan signal, the plurality of second wirings are used to provide power signal, and a width of one of the plurality of second wirings is greater than a width of one of the plurality of first wirings.

2. The electronic device as claimed in claim 1, wherein the substrate further comprises a side surface connected to the first surface and the second surface, and the electronic device further comprises:
   a plurality of first side circuits disposed on the side surface and each of the plurality of first side circuits is electrically connected to a respective first wiring; and
   a plurality of second side circuits disposed on the side surface and each of the plurality of second side circuits is electrically connected to a respective second wiring, wherein the plurality of first side circuits and the plurality of second side circuits do not overlap.

3. The electronic device as claimed in claim 2, wherein the plurality of first side circuits and the plurality of second side circuits are alternately arranged in a direction.

4. The electronic device as claimed in claim 3, wherein one of the plurality of first side circuits is adjacent to one of the plurality of second side circuits and they are separated by a first distance, and the first distance is in a range from 50 micrometers to 300 micrometers.

5. The electronic device as claimed in claim 2, wherein wirings disposed on the first surface are electrically connected to the light-emitting unit, and are electrically connected to the plurality of first wirings and the plurality of second wirings through the plurality of first side circuits and the plurality of second side circuits.

6. The electronic device as claimed in claim 1, further comprising:
   a protective layer having a first sublayer and a second sublayer, wherein the first sublayer covers the plurality of first wirings, and the second sublayer covers the plurality of second wirings.

7. The electronic device as claimed in claim 1, further comprising:
   a driving element disposed on the second surface and electrically connected to the plurality of first wirings and the plurality of second wirings.

8. The electronic device as claimed in claim 7, wherein the substrate further comprises a side surface connected to the first surface and the second surface, and the side surface have a first side and a second side that is opposite to the first side,
   wherein at least one of the first wirings extends from the first side to a bottom surface of the driving element, but does not extend to the second side.

9. The electronic device as claimed in claim 7, wherein at least one of the plurality of second wirings has a plurality of branch wirings, and the plurality of branch wirings converge and extend to a bottom surface of the driving element.

10. The electronic device as claimed in claim 7, wherein a number of the plurality of second wirings corresponding to a bottom surface of the driving element is less than a number of the plurality of first wirings corresponding to the bottom surface of the driving element.

11. The electronic device as claimed in claim 1, wherein at least one of the plurality of second wirings has a plurality of branch wirings, and the plurality of first wirings do not have branch wirings.

12. The electronic device as claimed in claim 1, wherein a first thickness of one of the plurality of second wirings on the second surface is greater than or equal to a second thickness of the one of the plurality of second wirings on the first surface.

13. An electronic device, comprising:
- a substrate having a first surface and a second surface, wherein the second surface is opposite the first surface;
- a light-emitting unit disposed on the first surface; and
- a circuit layer disposed on the second surface, wherein the circuit layer comprises a first layer, the first layer comprises a plurality of first wirings and a plurality of second wirings, and one of the plurality of second wirings is disposed between two adjacent ones of the plurality of first wirings,
- wherein the plurality of first wirings are used to provide data signal or scan signal, the plurality of second wirings are used to provide power signal, and a width of one of the plurality of second wirings is greater than a width of one of the plurality of first wirings.

14. The electronic device as claimed in claim 13, wherein the substrate further comprises a side surface connected to the first surface and the second surface, and the electronic device further comprises:
- a plurality of first side circuits disposed on the side surface and each of the plurality of first side circuits is electrically connected to a respective first wiring; and
- a plurality of second side circuits disposed on the side surface and each of the plurality of second side circuits is electrically connected a respective second wiring, wherein the plurality of first side circuits and the plurality of second side circuits do not overlap.

15. The electronic device as claimed in claim 13, wherein the plurality of first wirings and the plurality of second wirings do not have branch wirings.

16. The electronic device as claimed in claim 13, wherein the substrate further comprises a side surface connected to the first surface and the second surface, and the side surface have a first side and a second side that is opposite to the first side,
- wherein at least one of the plurality of second wirings extends from the first side to the second side.

17. The electronic device as claimed in claim 13, further comprising:
- a protective layer covering the plurality of first wirings and the plurality of second wirings, wherein the protective layer has a single-layer structure.

* * * * *